United States Patent

Revankar et al.

[11] Patent Number: 5,693,305
[45] Date of Patent: Dec. 2, 1997

[54] METHOD FOR SYNTHESIZING ALUMINUM NITRIDE WHISKERS

[75] Inventors: Vithal Revankar; Arvind Goel, both of Buffalo, N.Y.

[73] Assignee: Advanced Refractory Technologies, Inc., Buffalo, N.Y.

[21] Appl. No.: 545,358

[22] Filed: Oct. 19, 1995

[51] Int. Cl.⁶ ............................................. C01B 21/72
[52] U.S. Cl. ............................................. 423/412
[58] Field of Search ............................... 423/412

[56] References Cited

U.S. PATENT DOCUMENTS

| | | |
|---|---|---|
| 5,153,057 | 10/1992 | Corbett et al. |
| 5,192,720 | 3/1993 | Hida et al. |
| 5,214,005 | 5/1993 | Yamakawa et al. |
| 5,335,712 | 8/1994 | Corbett et al. |

FOREIGN PATENT DOCUMENTS

| | | | |
|---|---|---|---|
| 124626 | 6/1986 | Japan | 423/412 |
| 261203 | 11/1986 | Japan | 423/412 |
| 283900 | 12/1987 | Japan | 423/412 |
| 62283900 | 12/1987 | Japan | |
| 6375000 | 4/1988 | Japan | |
| 1308898 | 12/1989 | Japan | |
| 264100 | 3/1990 | Japan | |
| 192408 | 7/1990 | Japan | 423/412 |
| 3187998 | 8/1991 | Japan | |
| 3215399 | 9/1991 | Japan | |
| 465100 | 3/1992 | Japan | |
| 497998 | 3/1992 | Japan | |
| 321504 | 11/1992 | Japan | 423/412 |
| 1171416 | 8/1985 | Russian Federation | 423/412 |

OTHER PUBLICATIONS

Portnoi et al., "Mechanism of Growth and Etching of Whisker Crystals of Aluminum Nitride," *Sov. Phys. Crystallogr.*, 18(3):376–378 (1973).
International Publication No. WO 91/19027 published 12 Dec. 1991.

*Primary Examiner*—Wayne Langel
*Attorney, Agent, or Firm*—Nixon, Hargrave, Devans & Doyle

[57] ABSTRACT

A method for making aluminum nitride whiskers comprising reacting a reactant bed of aluminum, alumina, ammonium chloride, with a metal-containing carbon catalyst in the presence of a nitrogen gas flow, such that a direct nitridation reaction, a carbothermal reaction and a transport species reaction occur concurrently.

25 Claims, 2 Drawing Sheets

METHOD FOR SYNTHESIZING ALUMINUM NITRIDE WHISKERS

FIELD OF THE INVENTION

The present invention relates to improved methods for preparing aluminum nitride whiskers. More specifically the invention relates to methods for increasing the purity, % yields and aspect ratios of aluminum nitride whiskers.

BACKGROUND OF THE INVENTION

Composite materials are a useful class of materials that are often both very strong, and lightweight. Composites contain a mixture, or mechanical combination on a macro scale, of two or more materials that are solid in the finished state, are mutually insoluble, and differ in chemical nature. The use of composite materials in refractory applications is relatively new. Many styles and forms of composite materials having desirable characteristics are currently being investigated.

In the field of composites, it is desirable to incorporate metal-containing "whiskers" into polymeric, ceramic, etc. matrices. Whiskers are single, axially oriented, crystalline filaments of metals, refractory materials, carbon, boron, etc. that have high length to width ratios (aspect ratios). They have tensile strengths of about 3 to about 6 million psi and have very high elastic moduli. Their useable upper temperature limit may be as high as 1700° C., and in inert atmospheres, may be as high as 2500° C. When whiskers are incorporated into the matrix of refractory materials such as ceramics, the overall strength of the material is increased. Such material strength is important for many ceramics applications, e.g. cutting surfaces, internal combustion engines, turbine and propeller parts, spacecraft and airplane exteriors, etc.

Aluminum nitride is one material that has been incorporated into composites. Aluminum nitride is an attractive material because of its hardness, high temperature stability, electrical properties and other desirable mechanical properties. The physical state of aluminum nitride is often changed to aluminum nitride whiskers to facilitate their incorporation into composites.

Aluminum nitride whiskers (AlNw) have a relatively high melting point of 2000° C., and a hardness of 7 to 8 in Moh's scale. AlN whiskers also exhibit good materials strength, high temperature stability, and electrical conductance (for refractory materials). Aluminum nitride whiskers have a tensile strength at least equal to silicon carbide (SiC) whiskers and a higher Young's modulus and thermal expansion coefficient than SiC whiskers or fibers. Further, aluminum nitride whiskers are thought to be more inherently compatible than SiC whiskers with other metal-containing components in a composite. Thermo-chemical calculations indicate that AlN whiskers should be compatible with SiC, $Al_2O_3$, $ZrO_2$, $Si_3N_4$, and $TiB_2$. Further, AlN whiskers have better chemical stability with iron aluminides and nickel aluminides than does SiC, and thus may find use in these and other metal matrix composites. Due to its higher thermal and electrical conductivity, AlN whiskers are an excellent candidate for polymer matrix composite (PMC), ceramic matrix composite (CMC), and high temperature metal matrix composite (MMC) applications. In addition, AlN whiskers could also be used as a whisker mat for advanced high temperature batteries, and other applications.

Unfortunately, the known processes for making AlN whiskers have exhibited yields of only 5–20%; inadequate for large scale manufacture. Further, known AlN whisker fabrication methods require high temperatures, greater than about 1600° C., using furnace equipment for prolonged reaction periods of up to 20 hours, and are not otherwise conducive to large scale manufacturing processes.

Many approaches have been suggested in the literature for the synthesis of AlN powder, including sol-gel processing, self-propagating high temperture synthesis direct nitridation (SHS), vapor phase synthesis, plasma synthesis, carbothermal nitridation (CTN) and chemical vapor deposition (CVD). For AlN whisker synthesis, reactive evaporation, sublimation of aluminum or aluminum nitride, CTN, halide conversion and CVD systems have been attempted. However, the high costs, high reaction temperatures, long reaction times, low yields and general difficulties attending known AlN whisker-making methods have limited their feasibility and widespread use.

SUMMARY OF THE INVENTION

The present invention is directed to a low cost, high yield, low temperature, and short reaction time method of making aluminum nitride whiskers. In one embodiment, the present invention relates to a method for making aluminum nitride whiskers by concurrently reacting aluminum in a carbothermic nitridation reaction, reacting alumina in a direct nitridation reaction, and reacting aluminum and alumina in a transport species reaction, in the presence of nitrogen, under conditions necessary to make aluminum nitride whiskers.

The present invention also relates to a method for making aluminum nitride whiskers by concurrently reacting aluminum in a direct nitridation reaction, and reacting aluminum in a transport species reaction, both under conditions necessary to make aluminum nitride whiskers.

The present invention also relates to a method for making aluminum nitride whiskers by providing a reactant bed comprising ammonium chloride, aluminum, alumina, and a metal-containing carbon catalyst. A flow of nitrogen is provided to the reactant bed, which is then heated, at a predetermined rate, to a temperature sufficient to initiate and maintain, in the bed, a direct nitridation reaction, concurrently with a carbothermic nitridation reaction, concurrently in the presence of a transport species reaction.

The present invention further relates to a method for making aluminum nitride whiskers comprising providing aluminum and alumina reactants in a reactant bed. A metal-containing carbon catalyst is mixed with the alumina. An amount of ammonium chloride is placed into the reactant bed. A flow of nitrogen is directed to the reactant bed. The reactant bed has a bulk density from about 0.05 g/cc to about 0.2 g/cc. The reactant bed is heated at a heating rate of from about 10° C./min. to about 25° C./min up to a reaction temperature of from about 900° C. to about 1600° C.

The invention also relates to a method for making aluminum nitride whiskers, whereby a reactant bed is established comprising ammonium chloride, aluminum, and a metal-containing carbon catalyst. The reactant bed has a bulk density of about 0.05 g/cc. The reactant bed is heated in the presence of a nitrogen flow. The aluminum is reacted with nitrogen in a direct nitridation reaction. Concurrently, the aluminum reacts with chlorine and nitrogen in a transport species reaction.

Still another embodiment of the present invention relates to aluminum nitride comprising about 25 to about 60% by volume aluminum nitride whiskers, with the whiskers having an aspect ratio from about 7 to about 20.

The methods of the present invention for making aluminum nitride whiskers have several advantages over the known processes including high whisker yield, low cost, simplicity of starting materials and conditions, reproducibility, whisker purity and short reaction time.

DETAILED DESCRIPTION OF THE INVENTION

The present invention is directed to a low cost, high yield, low temperature method of making aluminum nitride whiskers. In one embodiment, the present invention relates to a method for preparing aluminum nitride whiskers by concurrently conducting an endothermic carbothermic nitridation reaction in the presence of an exothermic direct nitridation reaction and a vapor transport species reaction.

Therefore, according to one embodiment of the present invention, three distinct but related reaction mechanisms are made to occur concurrently. In this way unprecedented batch yields and whisker purity of the AlN whiskers are achieved. The concurrent reaction mechanisms occur as follows:

1. Self-Propagating High Temperature Synthesis (SHS)
Direct Nitridation Reaction (Exothermic)

2. Carbothermal Nitridation (CTN) Reaction (Endothermic)

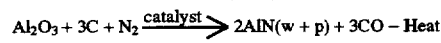

3. Transport Species Reaction Mechanism

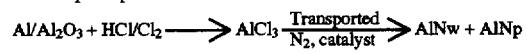

In the above reactions, the "w" refers to aluminum nitride whiskers, while the "p" denotes aluminum nitride particulate that includes aluminum nitride powder, but no whiskers.

Figure 1:
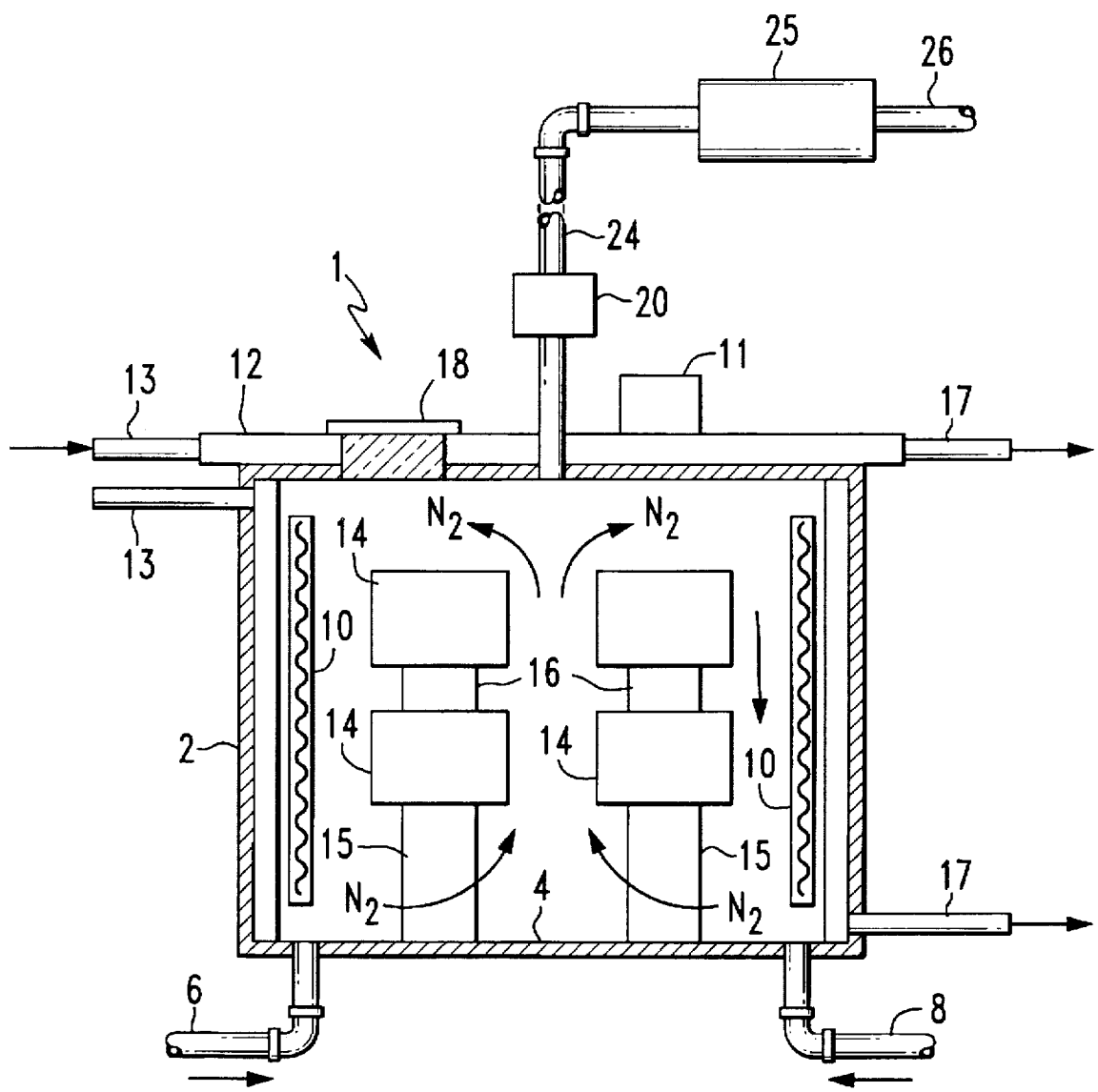
FIG. 1 is an exposed side view schematic representation of a box furnace in which batch-type AlNw synthesis occurs.
Figure 2:
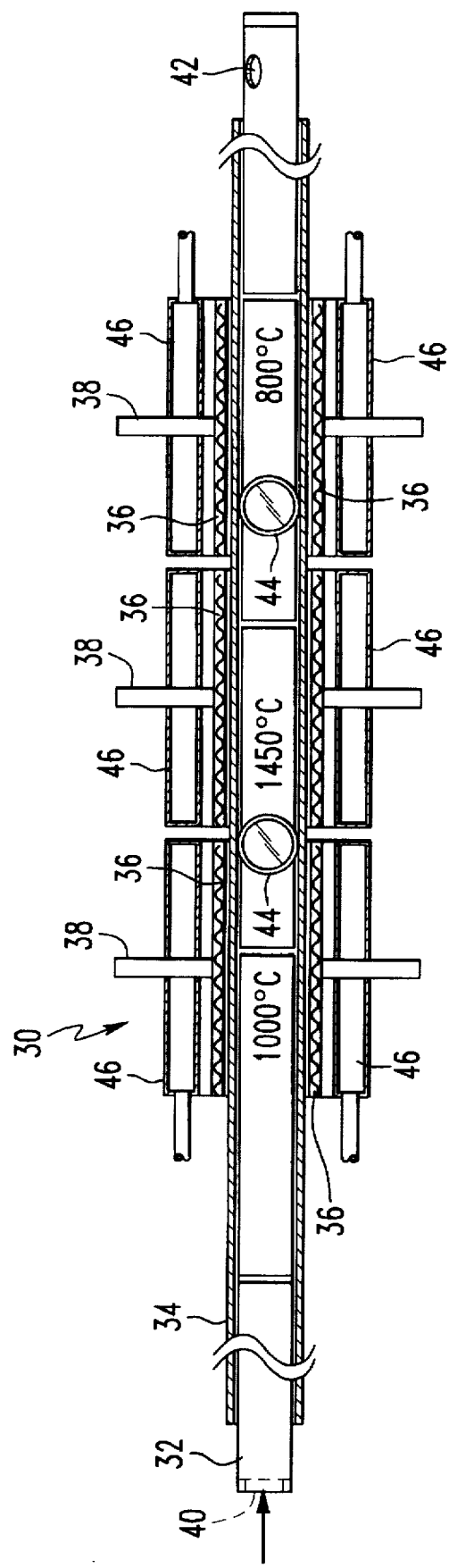
FIG. 2 is a side view of a schematic representation of a continuous synthesis reactor for the continuous synthesis of AlNw.

The SHS reaction shown above is an exothermic reaction. The heat released is absorbed to an extent by the CTN reaction, which is endothermic. As a result of the combination of these two reactions occurring together, less energy in the form of heat needs to be supplied to the reaction via external heating means, e.g. a box- or tube-type furnace as shown in FIGS. 1 and 2. In the SHS reaction, aluminum is preferably provided in the form of cut, or chopped aluminum fibers. Nitrogen is provided to the reaction in the form of nitrogen gas pumped into the furnace, and also from the dissociation of ammonium chloride in the presence of heat. A combination of aluminum nitride whiskers and aluminum nitride particulate is formed as reaction product. Heat is supplied to the SHS reaction, by heating the furnace at a predetermined rate to a specified reaction temperature needed at a predetermined heating rate. Once the SHS reaction is initiated, it will generate heat sufficient to run to completion and will provide heat to drive the CTN reaction.

In the endothermic CTN reaction, alumina in the form of a powder reacts with carbon provided from a carbon source, preferably carbonized cotton or high surface area carbon powder, and nitrogen in the presence of a metal-containing catalyst. A combination of AlN whiskers and AlN particulate are formed as a product, along with carbon monoxide. The heat absorbing aspect of the CTN reaction helps to regulate and stabilize the reaction temperature in the furnace. In known exothermic AlNw syntheses, the reaction temperature must be regulated by exterior cooling means, such as circulating cooling gases or liquids about the furnace. In the present invention, the CTN reaction works to keep the SHS reaction from creating an excessively high reaction temperature within the furnace. If the reaction temperature is not kept below about 1600° C., the aluminum fibers can melt. If the aluminum melts, the bulk density of the reactant bed increases (porosity decreases) and the available nitrogen cannot react with the aluminum efficiently enough to produce high whisker yield. In addition, if the reaction temperature exceeds 2000° C., the newly formed whiskers may be destroyed.

In addition to the SHS and CTN reactions, it is believed that the AlNw % yield observed from the two reactions is enhanced by the presence of a third reaction mechanism. It is believed that the chlorine atoms and derivative ions (e.g. chloride ions) released from the ammonium chloride, as well as the hydrogen chloride gas optionally provided, facilitate a transport species reaction whereby the aluminum and alumina react with the chlorine atoms and chloride ions. It is believed, that vapor transport gases or halides, react with reduced aluminum or aluminum-containing ions, to form $AlCl_3$ which is transported to whisker growth sites in the reaction bed of the vessel. There, the aluminum is reduced and reacts with nitrogen to form AlN, at least partially in the form of whiskers. This mechanism is not completely understood. However, it is clear from the AlNw % yields obtained, that a third mechanism is contributing to whisker growth in addition to the CTN and SHS mechanisms. When an excess of chlorine is made available to the reaction furnace (e.g. HCl or $Cl_2$) the whiskers yields increase. The combination of whiskers being formed from the three simultaneous reactions results in outstanding AlNw % yield of up to from about 20 to about 60% by volume of total AlN (AlN whiskers and particulate), with an average observed yield of from about 35 to about 40% by volume.

To create a proper atmosphere for whisker growth, and to produce optimum yields of aluminum nitride whiskers, certain reaction parameters must be closely controlled. The main parameters are reactant composition, bulk density of the reactant mass (porosity of the reactant bed), the catalyst selected, and the percolating/transport species material (e.g. ammonium chloride).

The porosity, or bulk density, of the reactant bed plays an important role in obtaining the high conversion and whisker yields which can be further manipulated by means of diluents and additives. The type and dimension of fibrous aluminum, alumina in a powder form, and carbon material selected, directly affects the bulk density of the reactant bed. It is important that the available nitrogen in the system easily gain access to the available aluminum to achieve optimum whisker growth. The porosity of the reactant bed is provided mainly by the dimensions and types of aluminum and carbon material selected. To optimize AlNw yield, the porosity or mass density of the reactant bed is established at from about 0.05 g/cc to about 0.20 g/cc, more preferably from about 0.05 g/cc to about 0.10 g/cc, with 0.05 g/cc being most preferred.

If the reactant bed porosity, or mass density is kept sufficiently low, (e.g. to about 0.05 g/cc), AlNw whisker yields of from about 5 to about 20% by volume are still obtainable even if no alumina is added to the mixture. In this instance, the carbothermal nitridation reaction will not occur, and only the SHS and transport species reaction will proceed as follows:

1. Self-Propagating High Temperature Synthesis (SHS) Direct Nitridation Reaction (Exothermic)

$$Al + N_2 \xrightarrow{catalyst} AlNw + AlNp + Heat$$

2. Transport Species Reaction Mechanism

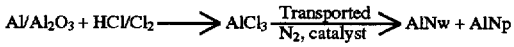

$$Al/Al_2O_3 + HCl/Cl_2 \longrightarrow AlCl_3 \xrightarrow[N_2, catalyst]{Transported} AlNw + AlNp$$

As noted above, the "w" refers to aluminum nitride whiskers, while the "p" denotes aluminum nitride particulate that includes aluminum nitride powder, but no whiskers.

The aluminum source materials are preferably cut or chopped aluminum fibers and alumina ($Al_2O_3$) in the form of a fine powder. These are readily available, and inexpensive starting materials. The preferred diameter of the aluminum fibers is in the range of from about 0.001" to about 0.008" and, more preferably, is in the range of from about 0.001" to about 0.003". The preferred length of aluminum fibers used for the preferred AlNw synthesis of the present invention is from about 0.10" to about 0.50" and more preferably about 0.25". Before reacting, any manufacturing surface residue is removed by treating the aluminum with acetone, followed by air drying.

Alumina generally has a particle size in the range of from about 0.1 to about 1 micron, and preferably from about 0.5 to about 1 micron. The dimensions of the alumina also affects the reaction bed porosity (bulk density) and is therefore important to the reaction rate and the % yield of AlNw.

A metal-containing carbon catalyst is provided to catalyze the reactions of the present invention. The catalyst comprises a carbon source which may be a carbon fiber such as any low density carbonized cotton, cellulose or other organic fiber, and is preferably carbonized cotton fiber. As an alternative, a low density high surface area carbon powder may be used as a carbon source (e.g. Raven™, Carbon Chemical Co., Atlanta Ga.).

The metal component of the metal-containing carbon catalyst may be made from any suitable metal, but is preferably Ni, Fe, Mg, Co, or compounds containing said metals, with nickel- and magnesium-containing compounds being particularly preferred for the high % yield production of aluminum nitride whiskers. The selected metal is preferably provided as a liquid solution applied to the carbon source. Preferred metal solutions are iron acetate, manganese acetate, cobalt acetate, magnesium nitrate, nickel nitrate, and combinations thereof, with nickel nitrate and magnesium nitrate being particularly preferred. The catalyst metal species are finely dispersed in solution on the low bulk density carbon source under wet soluble conditions to assure that the catalyst remains in place during the reaction. The resultant metal-containing carbon mass is dried and heat treated to get a finely dispersed catalyst.

Alternatively, the metal-containing solution is prepared, followed by immersing the carbon source into the metal solution. A small amount of water may be added, if necessary, until the material is completely immersed. The resultant material is dried, either on a hot plate for about one hour, or at room temperature overnight. This metal-containing carbon mass is heat treated in a nitrogen, argon or hydrogen atmosphere at around 400° C. for 30 minutes. The carbon source now comprises the metal-containing solution and is together considered to be the metal-containing carbon catalyst.

In a preferred embodiment, an amount of ammonium chloride is added to the bottom of a reaction vessel, or "boat", as the first layer. The preferred reaction vessels preferably have a volume capacity greater than about 1600 cc. One preferred vessel is about 60 cm in length, 10 cm in width and 5 cm in height. The ammonium chloride acts as a so-called percolating agent giving rise to transport species to assist the reaction by providing an additional nitrogen and chlorine source. In its role as a percolating agent, the ammonium chloride is thought to assist in maintaining the porosity of the reaction bed at a level of from about 0.05 to about 0.2 g/cc, preferably 0.05 to about 0.1 g/cc throughout the reaction.

The cut aluminum fibers are placed onto the ammonium chloride layer. The alumina and metal-containing carbon catalyst are mixed together with an amount of isopropyl alcohol and a dispersant, preferably a polyacrylic acid-containing dispersant, preferably creating a paste. This paste is spread onto the aluminum. Alternately, the paste may be thinned with isopropyl alcohol and sprayed onto the aluminum with a sprayer. The catalyst may be applied to the aluminum in the reaction vessel ("boat") or before being placed into the "boat". A final layer of ammonium chloride is optionally placed over the contents as a final layer. The "boat" is then placed into the reaction furnace.

The reaction furnace may be any type of enclosed device which is capable of withstanding a positive pressure of about 1 atmosphere, or being vacuum pumped to a negative pressure. The furnace has gas ports to allow gas to be pumped into and away from the reaction, and is heated to required reaction temperatures of from about 900° C. to about 1600° C., and more preferably from about 1450° C. to about 1550° C.

FIG. 1 shows a box-type furnace, such as may be used with the present invention. The furnace 1 comprises exterior walls 2 and interior walls 4. Gas inlets 6, 8 direct $N_2$ and/or HCl gas from a source (not shown) into the furnace 1. The random directed nitrogen flow within the furnace is shown by arrows. Heating elements 10 provide heat to the furnace 1 and are connected to necessary thermostats and electrical temperature controls 11 which may be automated and which are readily understood to those skilled in the field of high temperature material fabrication. The furnace 1 may optionally have a cooling means 12 through which a cooling fluid or gas flows in the direction from inlets 13 to outlets 17 to keep the preferably stainless steel furnace from overheating and oxidizing. Reaction vessels or "boats" 14 are shown in a stacked configuration with carbon block spacers 16 shown separating vertically the vessels 14, preferably about 5 cm apart, and assuring that nitrogen flow is accessible to the contents of the reaction vessels. The lower boats are set on supports 15 which are made from any material porous enough to allow the nitrogen flow to pass to an extent therethrough. As the number of stacked vessels in the furnace increases, the nitrogen gas flow rate increases accordingly. The furnace may include a window 18, and a regulator 20 to control furnace pressure, and allow the system to be purged upon completion of the reaction. The outlet 24 directs reactant gases to scrubber 25 and ultimate exhaust 26. The box-type furnace shown in FIG. 1 would be useful for batch-type preparation of AlNw.

FIG. 2 shows a schematic representation of a continuous synthesis reactor 30 useful for the fabrication of AlNw in a continuous mode. The reactor 30 comprises a series of reactant vessel or "boat" tubes 32. The boat tubes 32 automatically progress through a reactor tube 34 via a mechanized means to drive the bboat tubes through the reactor tube in a continuous fashion (not shown). The tube is heated via heating plates 36 controlled by the temperature controls 38. Nitrogen and/or HCl is introduced to the system at opening 40 The gases are directed through the reactor 30 and out the outlet 42 to a scrubber and exhaust (not shown). Windows 44 are provided and an external cooling means such as a water jacket 46, through which chilled water or other material may flow, is used to protect the furnace from overheating.

According to a preferred embodiment, the reactor furnace containing the reaction vessel is purged with nitrogen, and maintained under ambient or higher pressure with a nitrogen flow rate of from about 15 SCFH to about 100 SCFH. Additional gas species may be directed to the reaction to affect whisker growth, such as HCl or $Cl_2$ gas. The furnace is then heated gently to a final temperature of from about 900° to about 1600° C. for a predetermined time to generate the aluminum nitride whiskers. The preferred temperature and time conditions as shown in the following examples is a final reaction temperature of from about 1450° C. to about 1550° C., and more preferably about 1450° C., for about 30 minutes. It is important, and a feature of the invention, that the heating rate be achieved gently to optimize whisker growth. The heating rate of from about 10° C./min. to about 25° C./min. gave excellent whisker yields, more preferably about 10° C./min to about 15° C./min., with about 12° C./min to about 15° C./min. being particularly preferred.

The resulting whisker material, after cooling, is then screened. The resulting crude aluminum nitride whisker and particulate material is soft and is easily screened through the 30 mesh screen. Less than 1% of the total AlN material was retained on the 30 mesh screen. Further beneficiation, if necessary, is done by hydrocycloning the AlN whisker and particulate mix using IPA solvent, resulting in 90% recovery of the AlN whiskers. The resulting AlNws produced according to the method of the present invention have a whisker diameter ranging from about 0.3 to about 3 microns with aspect ratios averaging from about 7 to about 20. Aspect ratios in excess of 20 were regularly observed. As shown in the examples, the quick process of the present invention has, using widely available low cost materials, produced aluminum nitride whiskers of various sizes; as long as 200 microns with diameters of from about 0.3 to about 3.0 microns.

Whisker yields of up to 70% by volume have been achieved, with the average % by volume of AlN whiskers to total AlN (whiskers and particulate) being from about 25 to about 60% by volume, with about 35 to about 40% by volume achieved over the majority of syntheses conducted. Overall AlN yields of 130–140% (based on starting amount of aluminum) were obtained, with stoichiometric AlN yields obtained of greater than 95% (based on total AlN formation —whiskers and particulate). The methods of the present invention allow the whisker sizes and yields obtained to be varied by changing the conditions and amounts of additives to meet the desired customer specifications.

The following examples serve only to further illustrate aspects of the present invention and should not be construed as limiting the invention.

EXAMPLE 1

Preparation of the Metal-Containing Catalyst—Nickel Nitrate Solution

The catalyst mix is prepared as follows. Nickel, in fine powder form was dissolved with concentrated nitric acid. An amount of nickel powder, 0.764 gram mole (45 g) was weighed and set aside. An amount of 67% nitric acid, 1.53 gram mole (147 g) was accurately weighed and placed into a beaker. Fifty cc of distilled water was added to the beaker. The previously weighed nickel powder was added to the beaker pinch by pinch until all of the material was consumed without creating an excessively exothermic reaction. The resulting material was the 0.764 gram mole nickel nitrate solution.

EXAMPLE 2

Preparation of the Metal-Containing Catalyst— Magnesium Nitrate Solution

A magnesium nitrate solution was prepared as shown in Example 1. An amount, 0.764 gram mole (18.34 gm) of magnesium powder was weighed and added to 1.53 gram mole of nitric acid (67%) solution. The procedure and the additions are followed as set forth above.

EXAMPLE 3

Preparation of the Metal-containing Carbon Catalyst

An amount, 1.677 gram mole (99% pure) carbonized cotton fiber (20.0 g) was accurately weighed and mixed with 0.764 gram mole of the nickel nitrate of Example 1, and 42 cc of the magnesium nitrate (0.112 gram mole) solution of Example 2. A small amount of water was added until the carbon material was completely immersed. The resultant material was dried on a hot plate for one hour. This mass was heat treated in nitrogen, argon or hydrogen atmosphere at around 400° C. for 30 minutes.

EXAMPLE 4

Preparation of the Alumina/Catalyst Mixture

Alumina was then mixed with the above metal-containing carbon catalyst mixture of Example 3. An amount (0.274 gram mole) of a fine grade alumina powder (Reynolds Metals Co., Richmond, Va.) was weighed and mixed with the above metal-containing carbon catalyst mix in 150 cc of isopropyl alcohol (IPA). A drop of polyacrylic-containing dispersant was added to prevent agglomeration.

EXAMPLE 5

Loading of the Reaction Vessel

A weighed amount, 0.056 gram mole (3.0 g) of ammonium chloride was spread evenly on the bottom of a reaction vessel having a volume capacity of about 1600 cc. A weighed amount, 3.704 gram mole (100 g) of aluminum fibers (chopped into about 0.25 inch lengths, and having a diameter of from about 0.001" to about 0.008") was placed into the reaction vessel and onto the ammonium chloride layer, to produce a bulk density of about 0.06 g/cc. Ten cc (or 7% of the total weight) of the above alumina and metal-containing carbon catalyst mix material was applied to the aluminum fibers via a spray bottle. An additional amount (0.5 g) of ammonium chloride was placed onto the aluminum and alumina-containing layers in the reaction vessel.

EXAMPLES 6–11

AlNw Preparation using Ni/Mg Catalyst

In Examples 6–11, aluminum nitride whiskers were prepared, using the Ni/Mg metal-containing carbon catalyst ("catalyst") of Example 3, according to the reaction preparation sequence of Example 5. All amounts shown are given in parts. In each of the following examples 6–18, the ammonium chloride "(bottom)" value refers to the layer of ammonium chloride placed into the bottom of the reaction vessel and covered with other reactants. The ammonium chloride "(top)" refers to the optional amount of ammonium chloride which is placed as a final layer, on top of the reactant bed in the reaction vessel.

EXAMPLE 6

The reactants were provided to the reaction chamber in the following amounts and subjected to the following conditions:

| | |
|---|---|
| Al | 100 (parts) |
| $Al_2O_3$ | 1 |
| $NH_4Cl$ (top) | 4 |
| Catalyst | 5 |
| $NH_4Cl$ (bottom) | 2 |
| Nitrogen Flow | 50 SCFH |
| HCl Flow | 2 SCFH |

The reaction temperature was maintained at 1450° C. for 20 minutes.

EXAMPLE 7

The reactants were provided to the reaction chamber in the following amounts and subjected to the following conditions:

| | |
|---|---|
| Al | 50 (parts) |
| $Al_2O_3$ | 1 |
| $NH_4Cl$ (top) | 2 |
| Catalyst | 6 |
| $NH_4Cl$ (bottom) | 1 |
| Nitrogen Flow | 50 SCFH |
| HCl Flow | 4 SCFH |

The reaction temperature was maintained at 1050° C. for minutes.

EXAMPLE 8

The reactants were provided to the reaction chamber in the following amounts and subjected to the following conditions:

| | |
|---|---|
| Al | 50 (parts) |
| $Al_2O_3$ | 1 |
| $NH_4Cl$ (top) | 2 |
| Catalyst | 6 |
| $NH_4Cl$ (bottom) | 1 |
| Nitrogen Flow | 50 SCFH |
| HCl Flow | 4 SCFH |

The reaction temperature was maintained at 1450° C. for minutes.

EXAMPLE 9

The reactants were provided to the reaction chamber in the following amounts and subjected to the following conditions:

| | |
|---|---|
| Al | 25 (parts) |
| $Al_2O_3$ | 1 |
| $NH_4Cl$ (top) | 2 |
| Catalyst | 7 |
| $NH_4Cl$ (bottom) | 1 |

| | |
|---|---|
| Nitrogen Flow | 50 SCFH |
| HCl Flow | 2 SCFH |

The reaction temperature was maintained at 1100° C. for 30 minutes.

EXAMPLE 10

The reactants were provided to the reaction chamber in the following amounts and subjected to the following conditions:

| | |
|---|---|
| Al | 25 (parts) |
| $Al_2O_3$ | 1 |
| $NH_4Cl$ (top) | 2 |
| Catalyst | 7 |
| $NH_4Cl$ (bottom) | 3 |
| Nitrogen Flow | 100 SCFH |
| HCl Flow | 8 SCFH |

The reaction temperature was maintained at 1450° C. for 30 minutes.

EXAMPLE 11

The reactants were provided to the reaction chamber in the following amounts and subjected to the following conditions:

| | |
|---|---|
| Al | 100 (parts) |
| $Al_2O_3$ | 1 |
| $NH_4Cl$ (top) | 4 |
| Catalyst | 5 |
| $NH_4Cl$ (bottom) | 4 |
| Nitrogen Flow | 100 SCFH |
| HCl Flow | 8 SCFH |

The reaction temperature was maintained at 1450° C. for 30 minutes. The resulting batches prepared according to the described reactions of Examples 6–11 were evaluated using a microscope to determine approximate whisker yield by % volume of total AlN produced (whisker and powder). The average whisker diameter was about 0.73 microns, with an average length of about 7 to about 10 microns. The average aspect ratio was about 7 to about 10. Viewing the resulting AlN whiskers using a scanning electron microscope showed defect-free, smooth whiskers. While the % yields by AlN whiskers by volume was between about 25 and 40% for whiskers prepared according to Examples 6–11, the conditions of Example 11 were most preferred, producing observed % yields of up to about 60% by volume.

EXAMPLE 12

Examples 12–13 were conducted to determine the effect the aluminum to alumina ratio ($Al:Al_2O_3$) has on AlN whisker yield. The reactants were provided to the reaction chamber in the following amounts and subjected to the following conditions:

| | |
|---|---|
| Al | 500 (parts) |
| $Al_2O_3$ | 1 |
| $NH_4Cl$ (top) | 4 |
| Catalyst | 4 |
| $NH_4Cl$ (bottom) | 1 |

| Nitrogen Flow | 45 SCFH |
| HCl Flow | — SCFH |

The reaction temperature was maintained at 1450° C. for 30 minutes. The average % yield by volume of the AlNw averaged from about 35 to about 40%.

EXAMPLE 13

The reactants were provided to the reaction chamber in the following amounts and subjected to the following conditions:

| Al | 10 (parts) |
| $Al_2O_3$ | 1 |
| $NH_4Cl$ (top) | 4 |
| Catalyst | 13 |
| $NH_4Cl$ (bottom) | 1 |
| Nitrogen Flow | 45 SCFH |
| HCl Flow | 2 SCFH |

The reaction temperature was maintained at 1550° C. for 30 minutes. The % yield of AlNw was about 25% by volume. Whisker yields in % by volume for the various formulations in the above Examples 6–13 varied from about 5 to about 15% between examples. However, the routinely observed yields in % by volume of from about 25 to about 40% by volume were superior to other known AlNw manufacturing techniques using more expensive starting materials and having much longer reaction times. The whiskers produced by the conditions listed in Example 13 produced less whiskers by % volume than those produced according to the conditions listed in Example 12. It was determined that as the aluminum to alumina ratio increased, the % yield of whiskers by % volume also increased.

EXAMPLE 14

Use of Different Catalysts

Examples 14–15 were conducted to determine what effect various catalysts have on whisker production. The reactants were provided to the reaction chamber in the following amounts and subjected to the following conditions. All amounts are given in parts.

| Al | 100 (parts) |
| $Al_2O_3$ | 1 |
| $NH_4Cl$ (top) | 2 |
| Cobalt Acetate | 6 |
| $NH_4Cl$ (bottom) | 1 |
| Nitrogen Flow | 50 SCFH |
| HCl Flow | 2 SCFH |

The reaction temperature was maintained at 1450° C. for 30 minutes. The % yield of AlNw was about 10 to about 20% by volume.

EXAMPLE 15

Use of Different Catalysts

The reactants were provided to the reaction chamber in the following amounts and subjected to the following conditions:

| Al | 100 (parts) |
| $Al_2O_3$ | 1 |
| $NH_4Cl$ (top) | 2 |
| Iron Nitrate | 6 |
| $NH_4Cl$ (bottom) | 1 |
| Nitrogen Flow | 50 SCFH |
| HCl Flow | 2 SCFH |

The reaction temperature was maintained at 1450° C. for 30 minutes. Whisker volume was about 10 to about 20% by volume.

EXAMPLE 16

Use of Different Reactants

Examples 16–18 were conducted to determine what effect various reactant gases could have on whisker production. The reactants were provided to the reaction chamber in the following amounts and subjected to the following conditions. All amounts are given in parts.

| Al | 100 (parts) |
| $Al_2O_3$ | 1 |
| $NH_4Cl$ (top) | 2 |
| Ni + Mg Catalyst | 4 |
| $NH_4Cl$ (bottom) | — |
| Nitrogen Flow | 50 SCFH |
| HCl Flow | 2 SCFH |
| Ammonia Flow | 10 SCFH |
| Chlorine Flow | 5 SCFH |

The reaction temperature was maintained at 1450° C. for 30 minutes.

EXAMPLE 17

The reactants were provided to the reaction chamber in the following amounts and subjected to the following conditions:

| Al | 100 (parts) |
| $Al_2O_3$ | 1 |
| $NH_4Cl$ (top) | 2 |
| Ni + Mg Catalyst | 4 |
| $NH_4Cl$ (bottom) | 1 |
| Nitrogen Flow | 50 SCFH |
| HCl Flow | 2 SCFH |
| Ammonia Flow | 2 SCFH |
| Chlorine Flow | 1 SCFH |

The reaction temperature was maintained at 1450° C. for 30 minutes.

EXAMPLE 18

The reactants were provided to the reaction chamber in the following amounts and subjected to the following conditions:

| Al | 100 (parts) |
| $Al_2O_3$ | 1 |
| $NH_4Cl$ (top) | 4 |
| Ni + Mg Catalyst | 4 |
| $NH_4Cl$ (bottom) | 1 |
| Nitrogen Flow | 50 SCFH |
| HCl Flow | 2 SCFH |

| | |
|---|---|
| Ammonia Flow | 1 SCFH |
| Chlorine Flow | 2 SCFH |

The reaction temperature was maintained at 1550° C. for 30 minutes. The % yields of AlN whiskers obtained from batches according to Examples 16–18 were again from about 25 to about 40% by total volume AlN. However, the use of chlorine and ammonia gas makes these methods more expensive and therefore less desirable as compared with the methods of Examples 6–15.

Many other modifications and variations of the present invention are possible to the skilled practitioner in the field in light of the teachings herein. It is therefore understood that, within the scope of the claims, the present invention can be practiced other than as herein specifically described.

What is claimed:

1. A method for making aluminum nitride whiskers comprising: in concurrent reactions in a reactant bed,
   reacting aluminum in the presence of nitrogen in a direct nitridation reaction under conditions necessary to make aluminum nitride whiskers;
   reacting alumina in the presence of nitrogen in a carbothermal nitridation reaction under conditions necessary to make aluminum nitride whiskers; and
   reacting aluminum and alumina in the presence of nitrogen in a transport species reaction under conditions necessary to make aluminum nitride whiskers.

2. The method according to claim 1, wherein the reactant bed comprises:
   aluminum, alumina, ammonium chloride and a metal-containing carbon catalyst.

3. The method according to claim 2, wherein the reactant bed is placed into a reaction vessel.

4. The method according to claim 2, wherein the reactant bed is heated in a furnace filled with a flow of nitrogen gas.

5. The method according to claim 2, wherein the reactant bed is heated at a heating rate of from about 10° C./min. to about 25° C./min.

6. The method according to claim 3, wherein the reactant bed is heated to a temperature of from about 900° C. to about 1600° C.

7. The method according to claim 2, wherein the aluminum is provided to the reactant bed in the form of aluminum fibers.

8. The method according to claim 2, wherein the metal-containing carbon catalyst comprises carbon selected from the group consisting of carbonized cotton, and carbon powder.

9. The method according to claim 2, wherein the metal-containing carbon catalyst comprises a metal-containing compound selected from the group consisting of nickel, magnesium, cobalt, manganese, iron and combinations thereof.

10. The method according to claim 9, wherein the metal-containing compound is nickel nitrate.

11. The method according to claim 9, wherein the metal-containing compound is a nickel nitrate and magnesium nitrate mixture.

12. The method according to claim 2, wherein the reactant bed has a mass density of from about 0.05 g/cc to about 0.20 g/cc.

13. The method according to claim 2, further comprising providing a flow of hydrogen chloride gas to the reactant bed.

14. The method according to claim 1 further comprising:
    heating the reactant bed at a heating rate of from about 10° C./min. to about 25° C./min. to a reaction temperature of from about 900° C. to about 1600° C., under conditions effective to produce aluminum nitride whiskers wherein the reactant bed comprises aluminum, alumina, a metal-containing carbon catalyst, and ammonium chloride in the presence of nitrogen, said bed having a mass density of from about 0.05 g/cc to about 0.2 g/cc.

15. A method for making aluminum nitride whiskers comprising: in concurrent reactions in a reactant bed,
    reacting aluminum in the presence of nitrogen in a direct nitridation reaction under conditions necessary to make aluminum nitride whiskers; and
    reacting aluminum in the presence of nitrogen in a transport species reaction under conditions necessary to make aluminum nitride whiskers.

16. The method according to claim 15, wherein the reactant bed comprises:
    aluminum, aluminum chloride and a metal-containing carbon catalyst, said bed having a bulk density of about 0.05 g/cc.

17. The method according to claim 16, wherein the reactant bed is heated at a heating rate of from about 10° C./min. to about 25° C./min.

18. The method according to claim 16, wherein the reactant bed is heated to a temperature of from about 900° C. to about 1600° C.

19. The method according to claim 16, wherein the aluminum is provided to the reactant bed in the form of aluminum fibers.

20. The method according to claim 16, wherein the metal-containing carbon catalyst comprises carbon selected from the group consisting of carbonized cotton and carbon powder.

21. The method according to claim 16, wherein the metal-containing carbon catalyst comprises a metal-containing compound selected from the group consisting of nickel, magnesium, cobalt, manganese, iron and combinations thereof.

22. The method according to claim 21, wherein the metal-containing compound is nickel nitrate.

23. The method according to claim 21, wherein the metal-containing compound is a nickel nitrate and magnesium nitrate mixture.

24. The method according to claim 16, further comprising providing a flow of hydrogen chloride gas to the reactant bed.

25. A method for making aluminum nitride whiskers comprising:
    providing a reactant bed comprising an amount of ammonium chloride as a first layer, an amount of aluminum as a second layer, an amount of alumina mixed with a metal-containing carbon catalyst applied to the aluminum, and optionally, an additional amount of ammonium chloride as a final top layer in the bed;
    providing a flow of nitrogen gas to the reactant bed; and
    heating the reactant bed to a temperature sufficient to conduct a first direct nitridation reaction concurrently with a second carbothermic nitridation reaction concurrently in the presence of a third transport species reaction, under conditions effective to produce aluminum nitride whiskers.

* * * * *